United States Patent [19]
Wisherd et al.

[11] Patent Number: 5,315,265
[45] Date of Patent: May 24, 1994

[54] LOW INTERMODULATION DISTORTION FET AMPLIFIER USING PARASITIC RESONANT MATCHING

[75] Inventors: David S. Wisherd; William H. McCalpin, both of Sunnyvale, Calif.

[73] Assignee: Spectrian, Inc., Mountain View, Calif.

[21] Appl. No.: 989,449

[22] Filed: Dec. 11, 1992

[51] Int. Cl.⁵ .............................................. H03F 3/193
[52] U.S. Cl. .................................... 330/277; 330/294; 330/306
[58] Field of Search ................ 330/277, 286, 294, 306

[56] References Cited

U.S. PATENT DOCUMENTS 3,441,865 4/1969 Siwko ............................. 330/294 X
3,495,183 2/1970 Doundoulakis et al. ....... 330/277 X
4,771,247 9/1988 Jacomb-Hood ................. 330/277

Primary Examiner—James B. Mullins
Attorney, Agent, or Firm—Townsend and Townsend Khourie and Crew

[57] ABSTRACT

An RF power FET amplifier is designed using parasitic resonant matching to reduce low intermodulation distortion. An input inductor is connected in parallel with the capacitance of the common-source input capacitance, an output inductor is connected in parallel with the common-source output capacitance. Feedback provided by the common-source capacitance between gate and drain is utilized to improve linearization and stability. The field effect transistor is designed so that the feedback signal resulting from the feedback capacitance is 180° with respect to the forward gain.

2 Claims, 1 Drawing Sheet

LOW INTERMODULATION DISTORTION FET AMPLIFIER USING PARASITIC RESONANT MATCHING

BACKGROUND OF THE INVENTION

This invention relates generally to radio frequency (RF) power amplifiers, and more particularly the invention relates to an RF power amplifier field effect transistor (FET) suitable for communications networks where low intermodulation distortion (IMD) products are a key design parameter.

Impedance matching is an important criteria of amplifier design and performance. Optimum gain is realized when the maximum available source power is delivered to the amplifier and the maximum available output power is extracted from the amplifier.

The impedance matching topography may take on a number of forms. Low-pass, high-pass, and band-pass techniques are typically employed using various combinations of lumped and distributed components. However, one dominant feature consistent throughout all prior designs is the impedance seen at the transistor terminals is simplified to an easily manageable two-port network. The two-port network design might be characterized by S-parameters, Y-parameters, Z-parameters, or any of the other known network design parameters.

FIG. 1 shows a typical low-pass matching topology that has been used to match a field effect transistor (FET) amplifier. The FET model, T1, includes a common-source input capacitance (Ciss), a common-source output capacitance (Coss), and a common-source capacitance between the gate and drain (Crss). An input resistor, $Z_s$, is equal to the input resistance of the gate and source when the field effect transistor is conducting. In accordance with prior art design techniques, a designer merely presents a conjugate impedance to the respective terminal once the terminal impedance has been appropriately characterized. For example, the input inductor, L1, in FIG. 1 matches the equivalent amplifier input impedance to the source impedance. Similarly, the output inductor, L2, matches the equivalent amplifier output impedance to the load impedance.

While the conjugate-matching technique will optimize the amplifier power gain, intermodulation distortion (IMD) products can be unpredictable. Intermodulation distortion is characterized by the appearance in the output of frequencies equal to the sums and differences of integral multiples of the two or more component frequencies present in an input wave. Most often, the amplifier must be mismatched at the output terminals to minimize unwanted IMD products. The tradeoffs between gain, efficiency and spectral purity compromise the optimum design.

The present invention is directed to providing a high gain, low IMD product, high efficiency RF power amplifier.

SUMMARY OF THE INVENTION

In accordance with the invention, parasitic resonant matching is employed in designing an RF power amplifier. Rather than simplifying a given terminal to an equivalent impedance, a conjugate match for the FET parasitic elements is provided. More particularly, an input inductive reactance is provided to match the device common-source input capacitive reactance, and an output inductive reactance is provided to match the device common-source output capacitive reactance. Further, the FET is fabricated so that the feedback provided by the common-source capacitance between the gate and drain is 180° with respect to the forward gain of the FET, thereby providing a negative feedback for linearization and stability.

The invention and objects and features thereof will be more readily apparent from the following detailed description and appended claims when taken with the drawing.

DETAILED DESCRIPTION OF ILLUSTRATED EMBODIMENT

Figure 1:
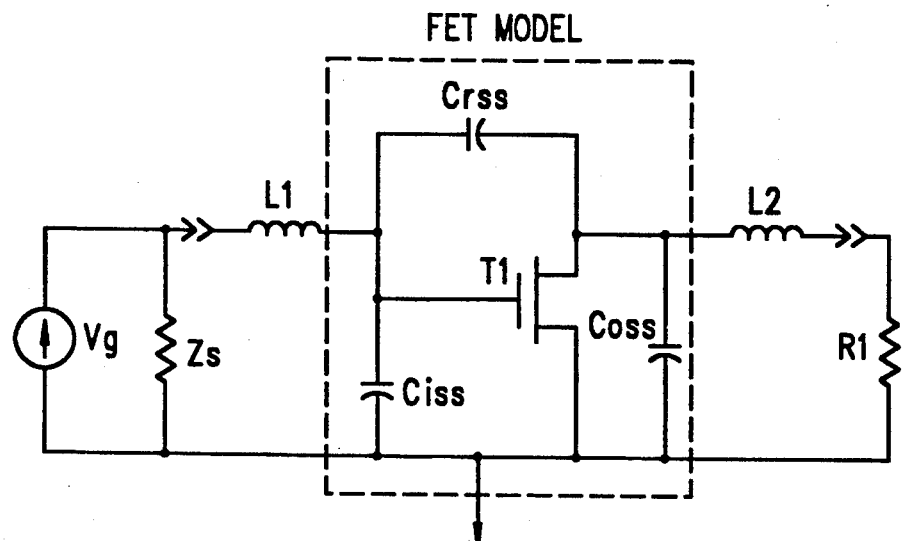
FIG. 1 is schematic diagram of a conventional low-pass matching network for an RF FET amplifier.
Figure 2:
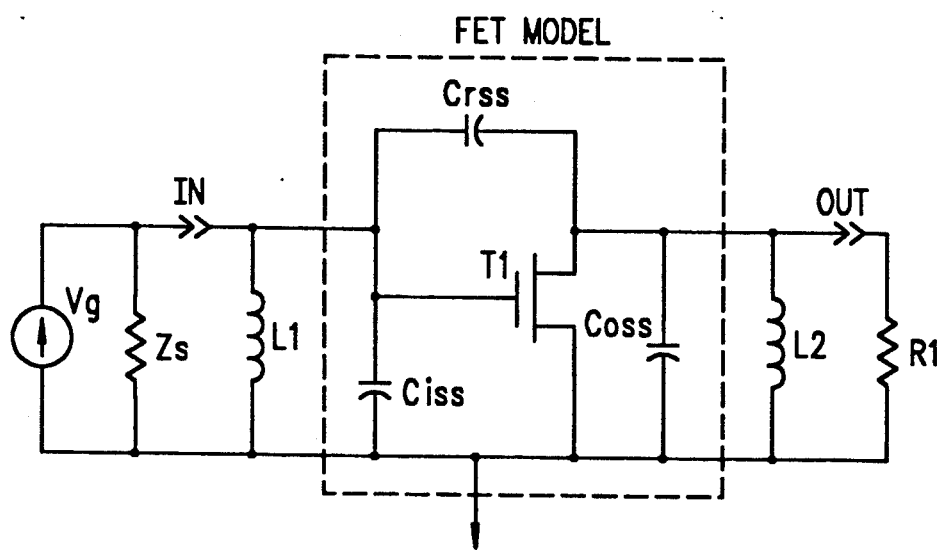
FIG. 2 is a schematic diagram of a matching network for an RF FET amplifier in accordance with the invention.

Referring now to the drawing, FIG. 2 is a schematic of an RF power amplifier including a matching network in accordance with the invention. Again, the FET model for the transistor T1 includes the common-source input capacitance (Ciss), the common-source output capacitance (Coss) and the common-source capacitance between gate and drain (Crss). The input resistance is again labelled $Z_s$. The resonant matching in accordance with the invention provides a conjugate match to the terminal parasitics. The input inductor, L1, is connected in parallel with the common-source input capacitance, and the reactance of the input inductor is a complex conjugate of the reactance of the input capacitance, as follows:

$$-jXL1 = jXCiss$$

Similarly, an output inductor, L2, is connected in parallel with the common-source output capacitance, Coss, and the reactance of the output inductor is a complex conjugate of the reactance of the device output capacitance, as follows:

$$-jXL2 = jXCoss$$

Since the input inductor and the common-source input capacitance form a parallel resonant circuit, all the generator voltage, $V_g$, appears at the FET gate terminal. Concurrently, the output inductor and the output capacitance form a parallel resonant circuit, and all of the drain voltage, $V_d$, appears across the load, RL. Under these conditions, the gain of the amplifier, expressed in terms of the complex variable s, is given by:

$$G(s) = gm \cdot RL$$

where gm is the device transconductance and the gm·RL product is the maximum available voltage gain for a FET.

Figure 3:
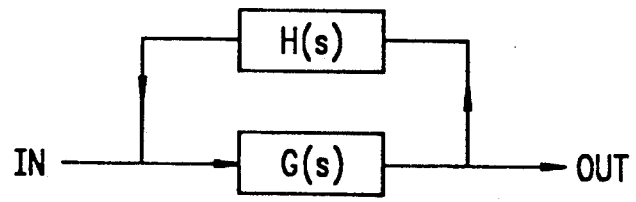
FIG. 3 is a functional block diagram illustrating feedback in the circuit of FIG. 2.

Potential instabilities can arise with high gain. However, the common-source capacitance between gate and drain provides a feedback path both for linearization and stability. The FET is fabricated so that the phase of the feedback signal resulting from Crss [H(s)] is 180° with respect to the forward gain, gm RL[G(s)]. Thus, by providing the appropriate feedback path, a significant improvement in linearity is achieved. Improvements in linearity produce corresponding improvements in spectral purity. More particularly, the IMD product levels drop considerably. Additionally, as changes in the amplifier environment take place, the feedback path serves to offset these changes. FIG. 3 is a functional block diagram of the amplifier with gain G(s) and feedback H(s) as provided by the parasitic resonant matching in accordance with the invention.

The parasitic resonant matching in accordance with the invention improves gain of a field effect transistor while providing both linearity and stability. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF power amplifier comprising:
 a field effect transistor having a source, a drain, and a gate, a common-source input capacitance and a common-source output capacitance,
 input circuit means for connecting an RF signal source having source resistance across said gate and said source, said input circuit means including an input inductor having a positive input reactance connected across said gate and said source, the reactance of said input inductor being equal in magnitude to the reactance of the common-source input capacitance,
 output circuit means for connecting a load having a load resistance across said drain and said source, said output circuit means including an output inductor having a positive output reactance connected across said drain and said source, the reactance of said output inductor being equal in magnitude to the reactance of the common-source output capacitance, and
 a negative feedback provided by a common-source capacitance between said gate and said drain, a feedback signal provided by said negative feedback being 180° with respect to forward gain of said amplifier.

2. The RF power amplifier as defined by claim 1 wherein said input circuit means includes an input resistor equal to the input resistance of said gate and source when said field effect transistor is conducting.

* * * * *